United States Patent [19]
Wang et al.

[11] Patent Number: 5,818,729
[45] Date of Patent: Oct. 6, 1998

[54] METHOD AND SYSTEM FOR PLACING CELLS USING QUADRATIC PLACEMENT AND A SPANNING TREE MODEL

[75] Inventors: Chi-Hung Wang, San Jose; Dwight D. Hill, San Carlos, both of Calif.

[73] Assignee: Synopsys, Inc., Mountain View, Calif.

[21] Appl. No.: 652,163

[22] Filed: May 23, 1996

[51] Int. Cl.$^6$ .................................................. G06F 17/50
[52] U.S. Cl. ........................................ 364/491; 364/489
[58] Field of Search .................................. 364/488, 489, 364/490, 491, 578, 251.6, DIG. 1

[56] References Cited

U.S. PATENT DOCUMENTS

| | | | |
|---|---|---|---|
| 4,908,772 | 3/1990 | Chi | 364/491 |
| 4,918,614 | 4/1990 | Modarres et al. | 364/490 |
| 5,119,317 | 6/1992 | Narikawa et al. | 364/512 |
| 5,267,176 | 11/1993 | Antreich et al. | 364/491 |
| 5,309,370 | 5/1994 | Wong | 364/490 |
| 5,349,536 | 9/1994 | Ashtaputre et al. | 364/491 |
| 5,566,078 | 10/1996 | Ding et al. | 364/490 |
| 5,638,293 | 6/1997 | Scepanovic et al. | 364/491 |

OTHER PUBLICATIONS

Kleinhans et al., "Gordian: VLSI Placement by Quadratic Programming and Slicing Optimization", Mar. 1991 IEEE Transactions on Computer–Aided Design vol. 10 No. 3.

Dunlop et al., "A Procedure for Placement of Standard–Cell VLSI Circuits", Jan. 1985 IEEE Transactions on Computer–Aided Design vol. CAD–4 No. 1.

Tsay et al., "Proud: A Fast Sea–of–Gates Placement Algorithm", 1988 25th ACM/IEEE Design Automation Conference, Paper 22.3.

Liang et al., "NC Algorithms for Finding Depth–First–Search Trees in Interval Graphs and Circular–Arc Graphs", IEEE, 1991, pp. 582–585.

Elias Dahlaus, "Efficient Parallel Algorithms on Chordal Graphs with a Sparse Tree Representation", IEEE, 1994, pp. 150–158.

*Primary Examiner*—Vincent N. Trans
*Assistant Examiner*—Thai Phan
*Attorney, Agent, or Firm*—Wagner, Murabito&Hao

[57] ABSTRACT

A system and method for placement of elements within an integrated circuit design using a spanning tree model and a quadratic optimization based placement. The system utilizes a conjugate-gradient quadratic formula based placement system (e.g., GORDIAN) which inputs an integrated circuit design in a netlist form and generates a connectivity matrix for each multi-pin net within the design. The quadratic placement system performs global optimization using a conjugate gradient solution to minimize wire lengths of cells in nets. Partitioning is also performed. The system and method herein utilizes a clique model of a multi-pin net to generate first connectivity matrices for the multi-pin nets which are run through the global optimization processes. This first run provides a rough placement of the elements of the multi-pin nets. A spanning tree process is then run on the initial cell placement and subsequent connectivity matrices are constructed using the spanning tree model, not the clique model for multi-pin nets within a defined size range. Although biased toward the initial placement, the overall placement process as described herein is more physically realistic and efficient using the spanning tree model which requires much less data for storage and processing thus allowing faster convergence. A placed netlist is the product.

20 Claims, 13 Drawing Sheets

640

| CELL | CONNECTION (OUTPUT, INPUT(S)) |
|---|---|
| A' | 1,7,8 |
| B' | 10,3,1 |
| C' | 4,12,100 |
| D' | 7,1 |
| E' | 20,8 |
| F' | 8,1 |

642    644

METHOD AND SYSTEM FOR PLACING CELLS USING QUADRATIC PLACEMENT AND A SPANNING TREE MODEL

BACKGROUND OF THE INVENTION (1) Field of the Invention

The present invention relates to the field of integrated circuit design. More specifically, the present invention relates to a system for automatically placing cells within an integrated circuit design.

(2) Background Technology

The acceptance of cell-based design style is influenced by the quality and speed of the available design tools. Cell-based design is performed with predefined or adaptable functional units called cells which are taken from a well tested cell library. Common layout styles are row-oriented standard cells and gate arrays. The task of placement, the first step in the physical design process for an integrated circuit, is to calculate the positions of the cells. Since the quality of the placement determines the minimal achievable area and wiring length of a circuit, placement has a large impact on production yield and circuit performance. Good placement tools allow the successful completion of routing with minimal or given area and must be able to process large designs. Therefore, increases in processing efficiency and speed for these tools are beneficial for large designs.

More specifically, automatic placement is the problem of assigning locations to cells (e.g., objects or elements) so as to minimize some overall cost function. In this area, the cost function is related to the wiring distance between cells. Cells must be assigned locations so that they do not overlap each other, they all fit within some overall bounding figure, and the total interconnect cost is minimized.

There are a number of different design tool approaches that have been proposed to solve the placement problem. One such method is disclosed in a paper entitled "PROUD: A Fast Sea-Of-Gates Placement Algorithm," published in the 25th ACM/IEEE Design Automation Conference (1988), paper 22.3, by Ren-Song Tsay, Ernest S. Kuh, and Chi-Ping Hsu. This approach takes advantage of inherent sparsity in the connectivity specification for an integrated circuit design and solves repeatedly sparse linear equations by the SOR (successive over-relation) method in a top-down hierarchy. However, this approach does not efficiently model nets in a manner that closely represents their physical layout positions in silicon.

Another approach is disclosed in a paper entitled "A Procedure for Placement of Standard-Cell VLSI Circuits," published in the IEEE Transactions on Computer-Aided Design, Vol. CAD-4, No. 1, Jan. 1985, by Alfred E. Dunlop and Brian W. Kernighan. This approach is based on graph partitioning to identify groups of modules that ought to be close to each other, and uses a technique for properly accounting for external connections at each level of partitioning. Similar to the above, this approach does not efficiently model nets in a manner that closely represents their physical layout positions in silicon.

Other approaches to the placement problem include min-cut, force-directed, simulated annealing, and spectral approaches. Some disadvantages associated with min-cut approaches are that they cannot jump out of local minimum, heavily rely on the initial solution, arrive at unstable results and lose global view after several cuts. Disadvantages associated with annealing based approaches are that they arrive at unstable results, have a mysterious cooling schedule, have long run times, and they fail to handle large designs. Disadvantageous associated with force-directed numerical method combining partition are that they restrict the simultaneous optimization to the initial step and lose the global view after several. cuts. In spectral approaches, the problem is represented by a large matrix that represents the position of each object and another matrix that represents the interconnectivity among objects. Still more matrices can be used to represent external or internal constraints, offsets caused by physical pin positions, weighting factors on cells or nets, etc.

In the above system, the matrices are manipulated and consolidated mathematically into one large system of equations, which is then solved. The solution represents an optimal solution for the positions of each cell. Because of various physical concerns, the solution may not be direct, but may involve numerous iterations of mathematical resolution, and numerous refinements in the actual positions of objects in the two dimensional plane. Such refinements typically divide ("slice") the starting rectangle into halves on each refinement pass, so that the cells' locations are specified in successively greater detail. In these systems, only non-zero entries of the matrices are stored in memory.

Integrated circuit designs that run through synthesis procedures tend to contain a number of multi-pin nets because these synthesis procedures tend to find a number of uses for a single output. There is an inherent problem in processing multi-pin nets (e.g., those nets that connect three or more cells) in the above type of placement approach because multi-pin nets are traditionally represented by a fully populated connectivity matrix which can consume great amounts of computer resources and requires long processing times. For example, if it is desired to place 10 k cells and each cell is only connected to two others, then about $3^*10$ k, or 30 k, entries are required. But, if 10 of the nets connect many cells (e.g., 200 cells), then $10^*[(200^*200)/2]$, or 20 k, entries are required to represent the 10 nets alone, and the other lower pin nets must also be represented. Under this system, multi-pin nets consume a disproportionate amount of computer resources.

Accordingly, what is needed is a placement approach that significantly reduces the usage of computer resources to represent multi-pin nets within a placement system that utilizes connectivity matrices. Further what is needed is a placement system as above that would not significantly decrease the accuracy of the placement solution. Further, what is needed is the above type of placement system that is biased toward an actual physical placement configuration of a net. The present invention offers the above advantages as well as others not specifically recited above but described herein.

SUMMARY OF THE INVENTION

A system and method are described for placement of elements ("cells") within an integrated circuit design using a spanning tree model and quadratic optimization based placement. The system utilizes a conjugate-gradient quadratic formula based placement system (e.g., GORDIAN) which inputs an integrated. circuit design in a netlist form and generates a connectivity matrix for each multi-pin net within the design. The GORDIAN placement system performs global optimization using a conjugate gradient process to minimize wire lengths of circuit elements in nets. Partitioning is also performed. The system and method herein utilizes a clique model of a multi-pin net to generate first (or initial) connectivity matrices for the multi-pin nets which are run through the global optimization processes. This first run provides a rough placement of the elements of the multi-pin nets. A spanning tree process is then run on the initial or rough placement data and subsequent connectivity matrices are constructed using the spanning tree model, not the clique method for multi-pin nets within a defined size range. Although biased toward the initial placement, the overall placement process as described herein is more efficient using the spanning tree model which requires much less data to store and process thus allowing faster convergence of the quadratic optimization based placement process. A placed netlist is the end product.

Embodiments of the present invention include a computer controlled placement method for cells of an integrated circuit design including the computer implemented steps of: (a) receiving an unplaced netlist representing the cells of the integrated circuit design and connections between the cells; (b) generating first connectivity matrices for each net of the netlist utilizing clique models to represent spatial affinities for cells within each multi-pin net; (c) performing global quadratic optimization based placement on the design utilizing the first connectivity matrices to produce a rough placement of the cells of the netlist; (d) generating spanning tree connectivity relationships for multi-pin nets of the netlist by performing a spanning tree procedure on the multi-pin nets utilizing cell locations of the rough placement of the cells of the netlist; (e) generating second connectivity matrices for each multi-pin net utilizing the spanning tree connectivity relationships; and (f) performing the global quadratic optimization based placement utilizing the second connectivity matrices to produce a placed netlist.

Further embodiments of the present invention include the above and further include the steps of: (g) partitioning the placed netlist into regions and defining partition constraints for cells of each region; (h) generating revised spanning tree connectivity relationships for the multi-pin nets by performing the spanning tree procedure on the multi-pin nets of the netlist based on cell locations of the placed netlist; (i) revising the second connectivity matrices for each multi-pin net utilizing the revised spanning tree connectivity relationships; (j) performing the global quadratic optimization based placement utilizing revised second connectivity matrices and utilizing the partitioning constraints to produce a revised placed netlist; (k) partitioning regions of the revised placed netlist into subregions and defining partition constraints for cells of each subregion; (l) repeating steps (h)–(k) until a predetermined set of cells exist within each subregion of the revised placed netlist. The present invention also includes a computer system implemented according with the above method.

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

NOTATION AND NOMENCLATURE

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. An procedure, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

COMPUTER SYSTEM OF THE PRESENT INVENTION

Figure 1:
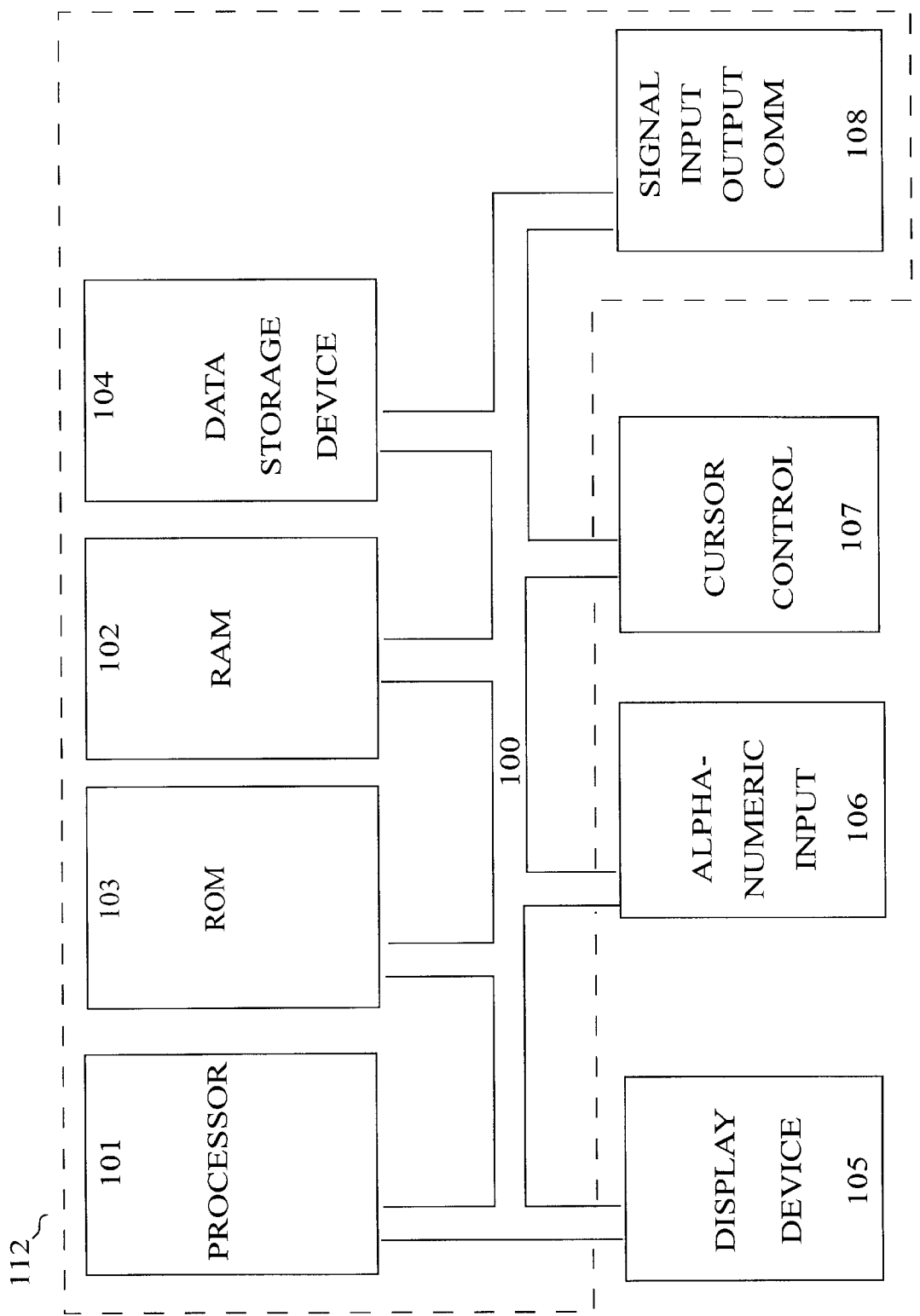
FIG. 1 illustrates a general purpose computer system which can be used to implement procedures, processes, logic blocks, etc., as described herein, of the present invention quadratic optimization based placement procedure.

Refer to FIG. 1 which illustrates an exemplary system 112. The placement procedures of the present invention are operable within computer system 112. When configured with the placement procedures of the present invention, system 112 becomes a computer aided design (CAD) tool 112, also of the present invention, for integrated circuit placement. Placement procedure 500 (FIG. 10A and FIG. 10B) of the present invention is implemented within system 112.

In general, computer systems 112 used by the preferred embodiment of the present invention comprise a bus 100 for communicating information, a central processor 101 coupled with the bus for processing information and instructions, a computer readable volatile memory 102 (e.g., random access memory) coupled with the bus 100 for storing information and instructions for the central processor 101, a computer readable read only memory 103 coupled with the bus 100 for storing static information and instructions for the processor 101, a data storage device 104 such as a magnetic or optical disk and disk drive coupled with the bus 100 for storing information and instructions, a display device 105 coupled to the bus 100 for displaying information to the computer user, an alphanumeric input device 106 including alphanumeric and function keys coupled to the bus 100 for communicating information and command selections to the central processor 101, a cursor control device 107 coupled to the bus for communicating user input information and command selections to the central processor 101, and a signal generating device 108 coupled to the bus 100 for communicating command selections to the processor 101.

The display device 105 of FIG. 1 utilized with the computer system 112 of the present invention may be a liquid crystal device, cathode ray tube, or other display device suitable for creating graphic images and alphanumeric characters recognizable to the user. The cursor control device 107 allows the computer user to dynamically signal the two dimensional movement of a visible symbol (pointer) on a display screen of the display device 105.

OVERALL OPERATION OF THE PRESENT INVENTION

Within the present invention, a dynamic spanning tree model (e.g., a minimum spanning tree model in one embodiment) is used in order to represent a circuit net. The spanning tree model is utilized each time the cell placement is changed making the solution more realistic and the convergence of the quadratic optimization much faster, since there are far fewer non-zero entries to process in the overall connectivity matrix.

Within discussions of the present invention, the term "connectivity relationship" is utilized with respect to cells of nets. This term refers to the spatial affinity cells within a given net have with respect to one another. If the connectivity relationship of two cells is positive (as indicated by non zero data points a corresponding connectivity matrix of the net) then the two cells have a spatial affinity for one another. During cell placement, there is an attempt to place together those cells having spatial affinities for one another. Therefore, a connectivity relationship represents the spatial affinity the cells have with respect to each other. The connectivity relationship of a net depends on the model employed to construct it, e.g., a clique (each connection is direct) or spanning tree model (indirect connections are allowed).

According to the overall placement process of the present invention, a rough cell placement is formulated for an input integrated design and this rough placement utilizes a number of well known quadratic based placement processes that utilize clique models to represent connectivity relationships of multi-pin nets. One type of placement process that can be used for this rough or initial placement is the GORDIAN system described in U.S. Pat. No. 5,267,176 by Antreich et al., issuing Nov. 30, 1993. Based on the rough placement, new connectivity relationships for the cells of the multi-pin nets is determined using a spanning tree procedure. In the spanning tree model, if cells are close to each other, then they are considered directly connected within a given net, otherwise they are connected indirectly (via the other cells on the same net). This reflects the manner in which the physical wiring is actually implemented with respect to the cell layout of the integrated circuit.

More specifically, the spanning tree process finds the set of lines that connects a set of points on a plane without loops. The connectivity relationship based on the spanning tree model is transferred back into the connectivity matrix for the cells on the multi-pin net and the placement process (e.g., GORDIAN) is allowed to continue using the spanning tree model. The connectivity matrix contains a non-zero entry for each nearby cell to cell relation (e.g., for each pair of cells that have a spatial affinity)- Since the relative positions of cells can change during processing; the spanning tree; process is recalculated each time (e.g., iteration) the global placement is updated. Thus, the terminology "dynamic" spanning tree is used herein.

Physical wiring does not connect every cell to every other cell directly (which is the approach many prior art systems use to represent multi-pin nets with clique models). In contrast, physical wiring usually follows a path more closely resembling a spanning tree model where many cells are connected to each other indirectly, through intermediary cells. For this reason, the present invention provides improved placement accuracy because the underlying model (e.g., spanning tree) better represents the actual physical layout than the prior art clique model.

PLACEMENT PROCEDURE OF THE PRESENT INVENTION

Figure 2A:
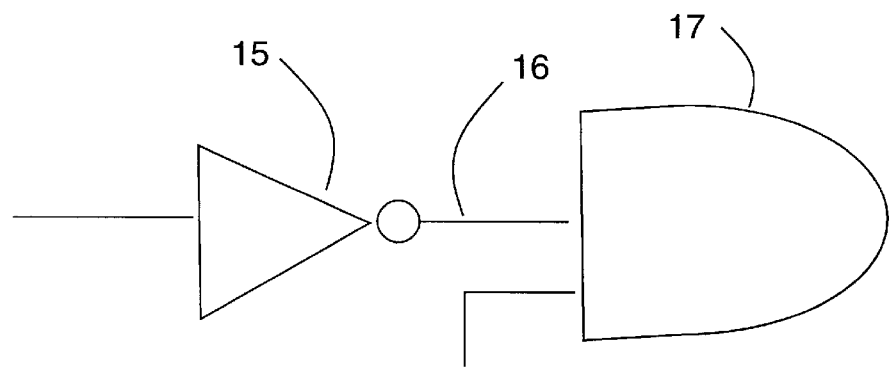
FIG. 2A illustrates a two pin net.
Figure 2B:
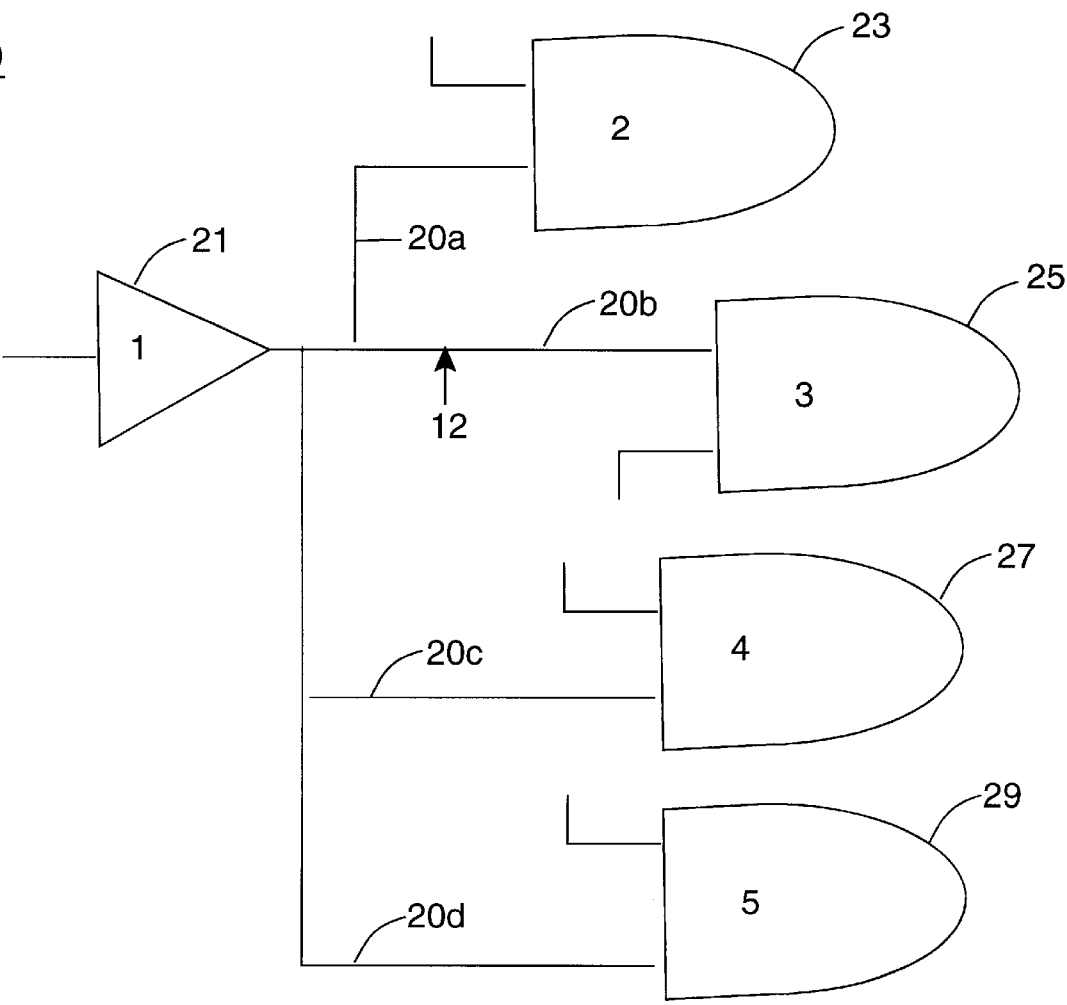
FIG. 2B illustrates a multi-pin net processed by the present invention.

With reference to FIG. 2A, an exemplary two pin net 16 is shown coupled between gate 15 and gate 17 of circuit 11. FIG. 2B illustrates a multi-pin net 12 in accordance with the present invention and is composed of five pins. Inverter 21 (cell1) drives a signal onto net 12 and gate 23 (cell2), gate 25 (cell3), gate 27 (cell4) and gate 29 (cell5) receives the signal. One goal of the placement procedure of the present invention is to place these cells 1–5 close to each other since they are part of multi-pin net 12. It is assumed that circuit 20 of FIG. 2B represents one net within a larger integrated circuit design comprised of many two pin and multi-pin nets.

Cliques are mathematical representations that are used in placement processes to construct connectivity matrices. Cliques model the spatial affinity a particular cell has to another cell within a multi-pin net. If the wire connections (20a–d) of circuit 20 of FIG. 2B were solely used to present the spatial affinity for these cells in the placement process, then each cell of cells 1–5 would be placed close to cell 21, but not necessary close to each other. However, it is advantageous to place all the cells of the net 12 close to each other. Therefore, in order to illustrate the spatial affinity that cells 1–5 have for each other, "edges" are used to connect these cells within the clique model.

Figure 3:
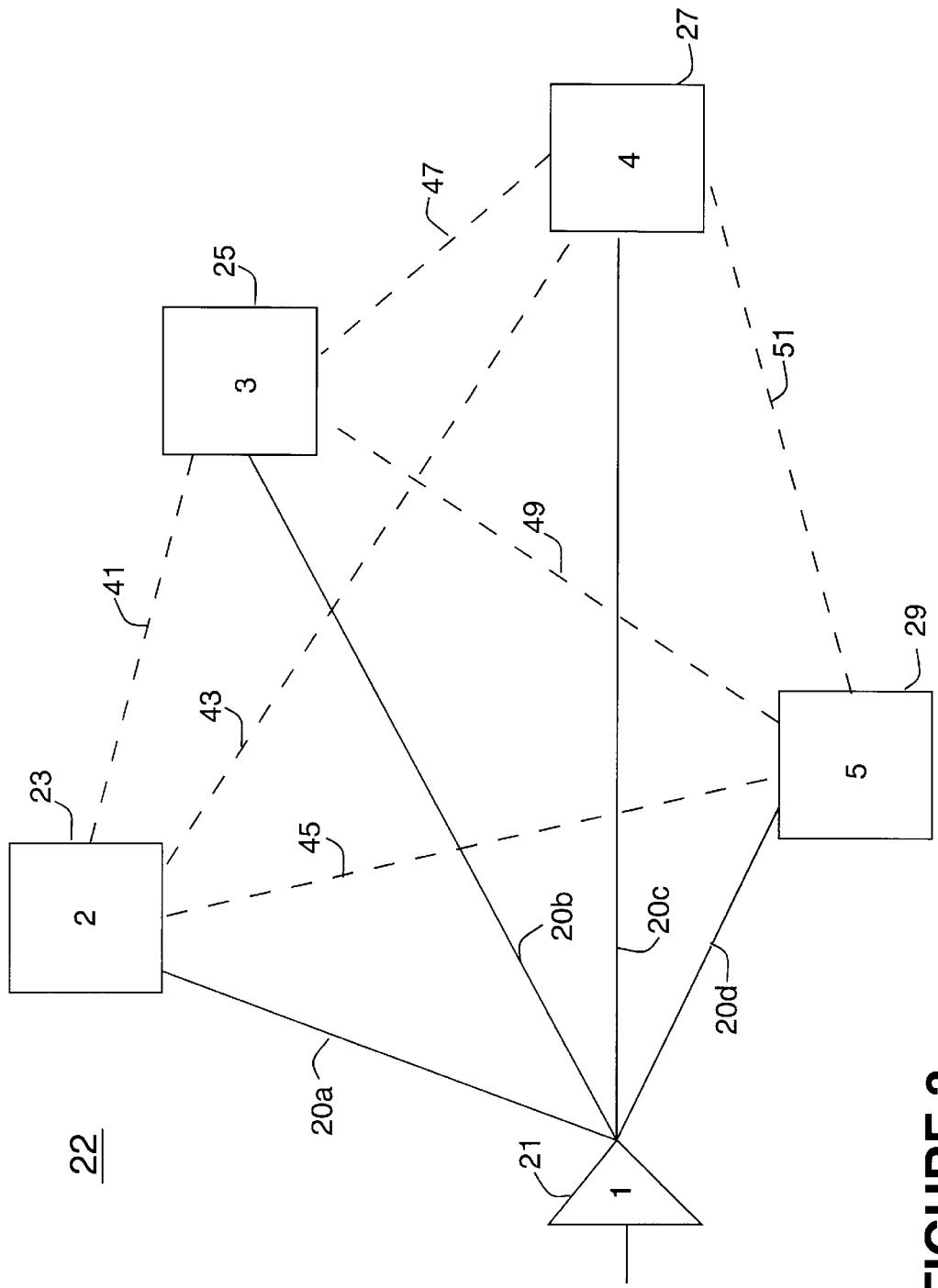
FIG. 3 illustrates a particular multi-pin net and its wire connections and "edges" in a clique model; the connections and edges indicate spatial affinity of the net elements.

A clique model 22 for circuit 20 is shown in FIG. 3. According to the clique model 22, wire connections 20a–20d are used to represent spatial affinity between cell 1 and the group of cells 2–5. In addition, edges 41, 43, and 45 are used to represent the spatial affinity between cell 2 and the group of cells 3, 4, and 5. Edges 47 and 49 are used to represent the spatial affinity between cell 3 and the group of cells 4 and 5. Lastly, edge 51 is used to represent the spatial affinity between cells 4 and 5. The edges are represented as dashed lines because they are used only to represent spatial affinity and do not represent wire connections with the clique model 22. Clique models 22 are well known.

With respect to a clique model, the wire connections and the edges constitute the connectivity relationship of the given net 22. Thus, the connectivity relationship indicates the spatial affinity of the cells of the net 22.

In a clique model, the number of wire connections and edges, R, used to represent a particular net depends on the number of pins within the net according to the below relationship where N represent the number of pins in the net.

$$R = \frac{(N-1) * (N)}{2}$$

For the clique 22 of FIG. 3, there are (4*5)/2 or 10 wire connections and edges used to represent the spatial affinity for cells of multi-pin net 12.

Figure 4:
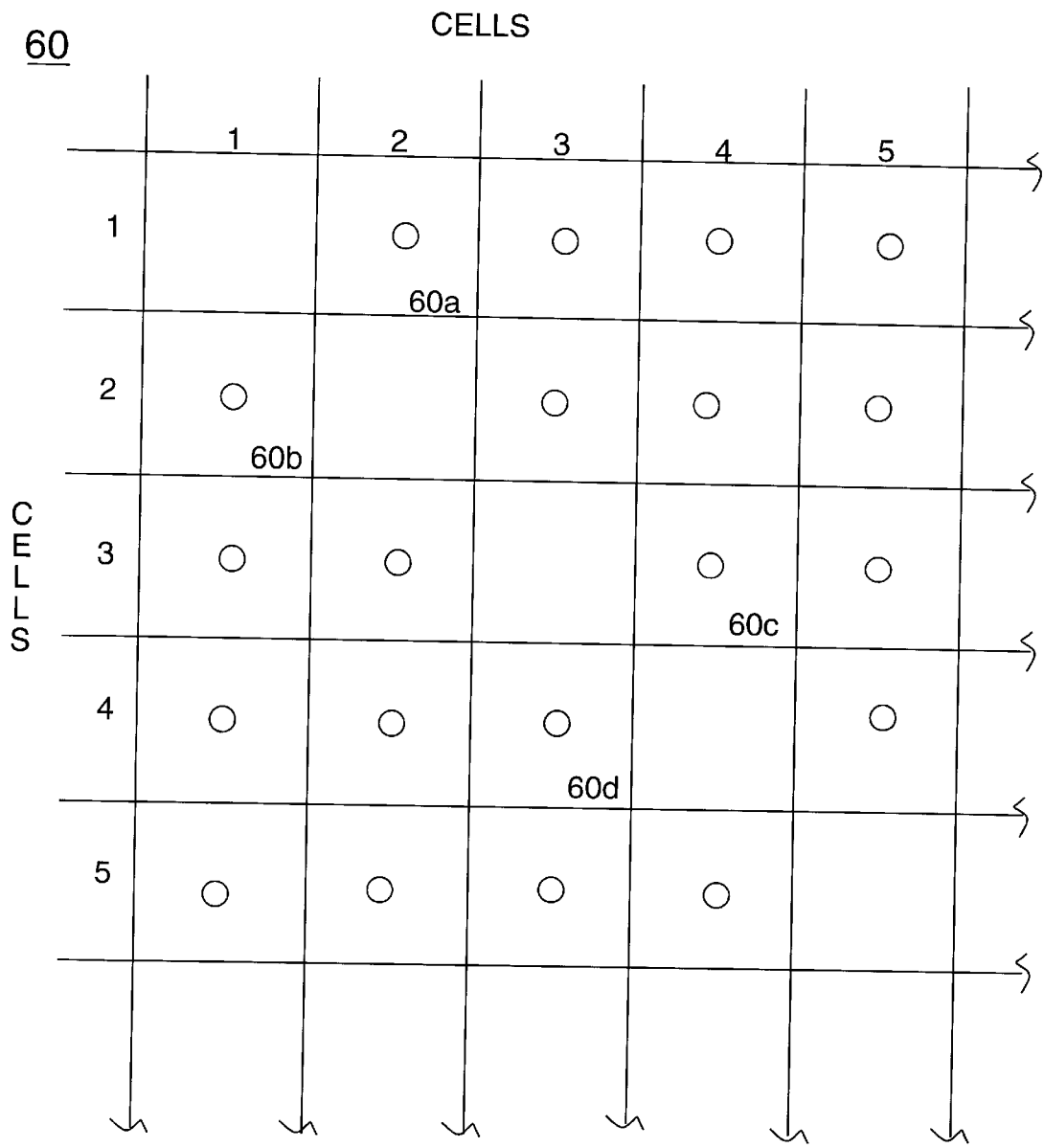
FIG. 4 illustrates a connectivity matrix generated by the present invention representing the clique model of the multi-pin net of FIG. 3.

FIG. 4 illustrates a portion of a connectivity matrix 60 generated by the placement process of the present invention based on the clique model of FIG. 3. The non-zero entries of connectivity matrix 60 is stored in memory 102 or 104 (FIG. 1) and is made for all of the cells of the integrated circuit design and only a small portion of this matrix 60 is used to represent net 12. Since the data is symmetrical, only one of the non-zero entries are actually stored in memory. Across the horizontal, are the five cells of the net 12 (1–5) and similarly down the vertical are the same five cells. A non zero entry is placed into a matrix entry when a connection (e.g., spatial affinity) is present between the cells within the clique model; a connection can result from a wire connection or from an edge. A small circle represents a non-zero entry. For instance, entry 60a represents the spatial affinity between cell2 and cell1. Since the matrix 60 also provides a mirror entry, entry 60b represents the spatial affinity between cell1 and cell2. Entry 60c represents the spatial affinity between cell4 and cell3. And entry 60d represents the spatial affinity between cell3 and cell4.

Depending on the relative priority of the spatial affinity, the non-zero matrix entry can represent a larger value within some predefined range. This aspect of the connectivity matrix 60 is not particularly pertinent to the present invention.

Entries of FIG. 4 that have a zero entry are empty and are not saved within the computer system 112. The memory requirements of system 112 to store the connectivity matrix 60 therefore depend only on the non-zero entries.

It is appreciated that there are 20 non-zero entries within connectivity matrix 60 of FIG. 4 to represent the clique 22 of FIG. 3. This is the case because R=10 and the matrix 60 contains a mirror image of the connectivity data as shown by entries 60a and 60b and entries 60c and 60d. Only 10 non-zero entries are stored.

Figure 5:
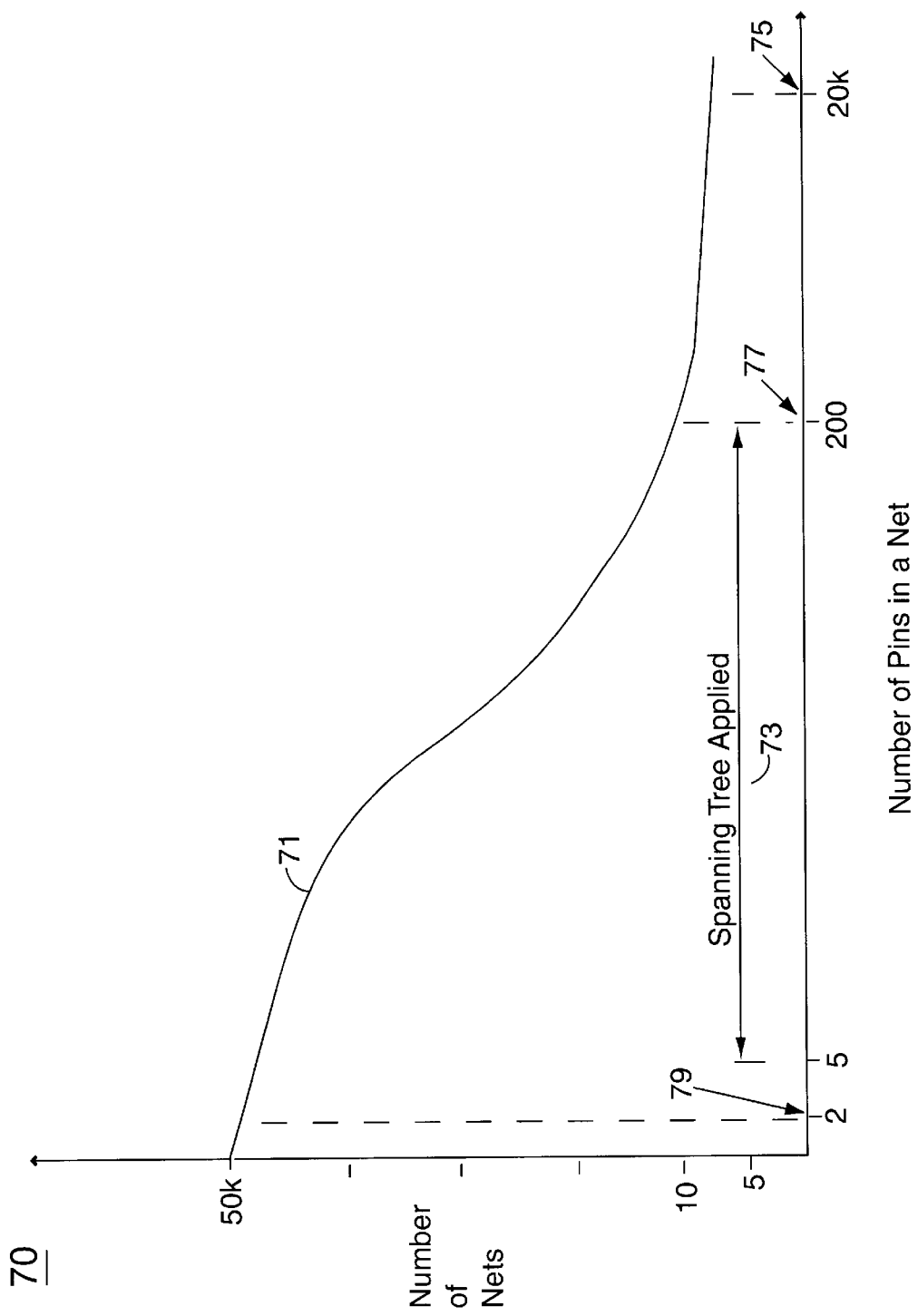
FIG. 5 is a graph illustrating number of nets versus number of pins for a multi-pin in typical integrated circuit designs.

FIG. 5 is a distribution graph 71 illustrating the number of nets (e.g. along the vertical in log scale) within a given integrated circuit design that belong to a multi-pin net of a given size (along the horizontal). For instance, as shown by 79 in an exemplary design, there are 50 k nets having two pins each. However, there are only 10 multi-pin nets having 200 pins each as shown by 77. A 200 pin net might be associated with a clock signal. Lastly, there are less than 5 nets having 20 k pins each or more, as shown by 75. A 20 k pin net might be associated with an enable signal that reaches a large percentage of the integrated circuit design. As shown by graph 71, most of the nets comprise 5–10 or fewer pins each. As discussed further below, within an input integrated circuit design, the spanning tree model of the present invention is applied to nets having sizes within the approximate range of 5–200 pins each. Nets smaller than the minimum range cutoff value can be modeled using cliques 22 (or some other representation) and nets larger than the maximum range cutoff value are generally ignored by the placement processes of the present invention because they are assumed to be too pervasive throughout the integrated circuit design.

Figure 6:
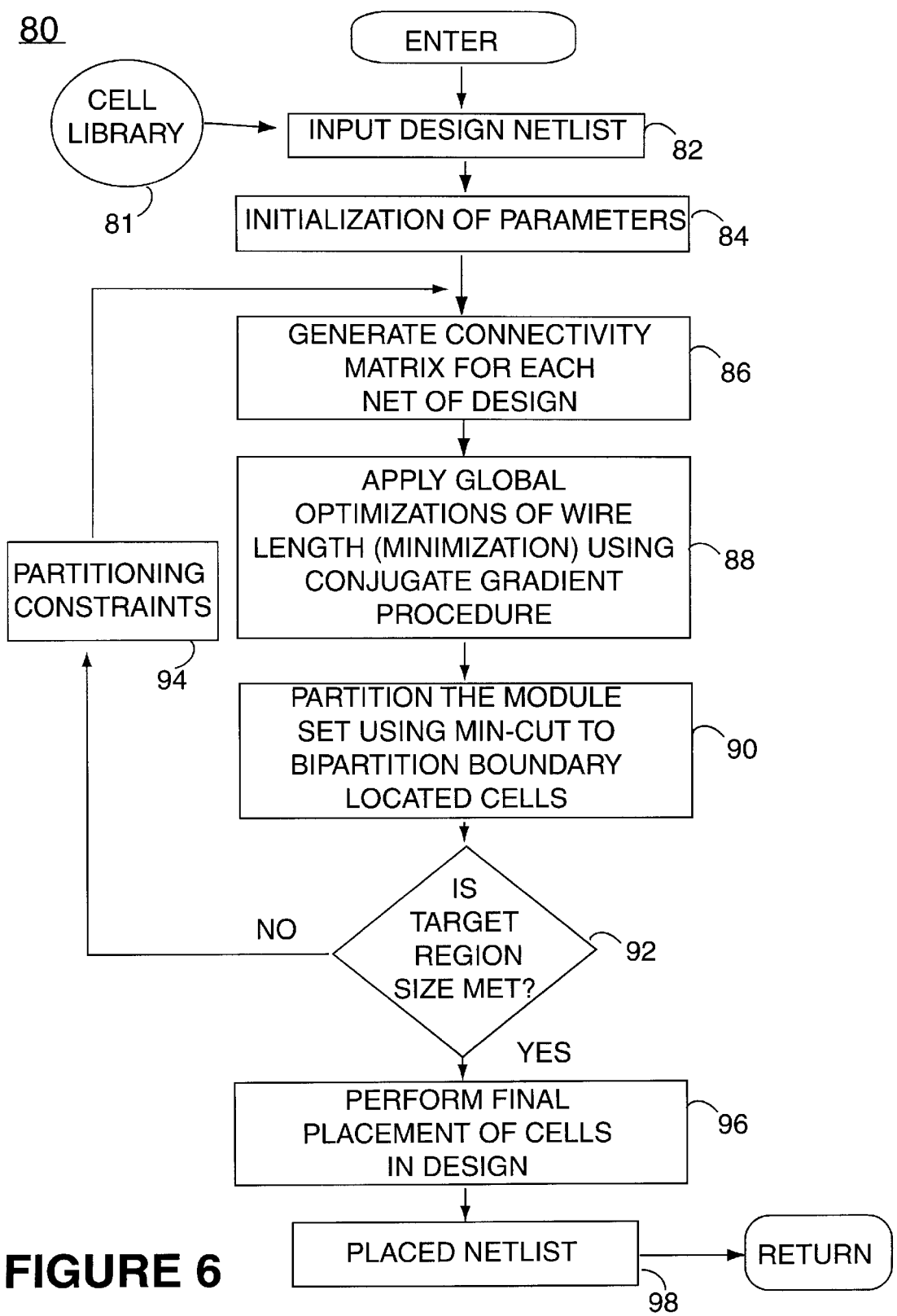
FIG. 6 is a flow diagram illustrating steps of a placement process using quadratic optimization based placement and using clique models for multi-pin nets.

FIG. 6 is a flow diagram of a computer controlled process 80 implemented within computer system 112 for cell placement of cells within an input netlist 82 representing an integrated circuit design. It is appreciated that process 80 is implemented as computer readable program code within computer readable memory (e.g., 102, 103, 104) of system 112. This process 80 is described in more detail within U.S. Pat. No. 5,267,176 by Antreich et al., issuing Nov. 30, 1993 and is also described within an article entitled "GORDIAN: VLSI Placement by Quadratic Programming and Slicing Optimization," by J. M. Kleinhans, G. Sigl, F. M. Johannes, and K. J. Anteich, published in IEEE Transactions on Computer-Aided Design, Vol. 10, No. 3, on March 1991. Placement process 80 inputs a netlist 82 representing an integrated circuit design and generated a placed netlist 98 where each element of the design is given a two dimensional (X,Y) placement. Advantages of using a GORDIAN approach is that its numerical method considers all partitions or regions in a design simultaneously (e.g., it is global), its repartition capability greatly improves the quality of the initial partition, it considers a design more globally, and the numerical method can be readily altered to adapt other methods and other costs.

The input netlist 82 of FIG. 6 is unplaced and is composed of cells and their interconnections but does not indicate their location or placement. Associated with the netlist 82 is usually an extract of the cell library to be used and a description of the geometry of the chip. The dimensions of each rectangular module (e.g., cell) as well as the location of its pins are taken from the cell library 81. At block 84, initial parameters are set. For instance, the initial target on the smallest region size is set (region-size) and target die size is set (e.g., 1.4 times total cell area) for 70% utilization. Also, I/O pin locations are determined either automatically or by predetermined information. At block 84, clique models are generated for cells that are to be grouped together. This is performed using the model shown in FIG. 3. The clique models represent the connectivity relationships of the cells within individual nets.

Block 86 of FIG. 6 generates the connectivity matrix for each net of the design 82. The connectivity matrices are generated based on the clique models generated in block 84. The non-zero entries of the connectivity matrices are stored in computer memory (e.g., 102 or 104); and each non-zero entry contains a data value (weight or priority value) and a pointer to the next non-zero entry. At block 88, system 112 applies global optimizations to minimize the distances between the elements of a net as indicated by the overall connectivity matrix for the design. A well known quadratic optimization based process is used as described in U.S. Pat. No. 5,267,176. To accomplish this optimization, block 88 uses the well known conjugate-gradient method for solving the problems of globally optimizing and determining the approximate cell locations from this process. Placement information (e.g., cell coordinates) are passed from block 88 to block 90.

Figure 7:
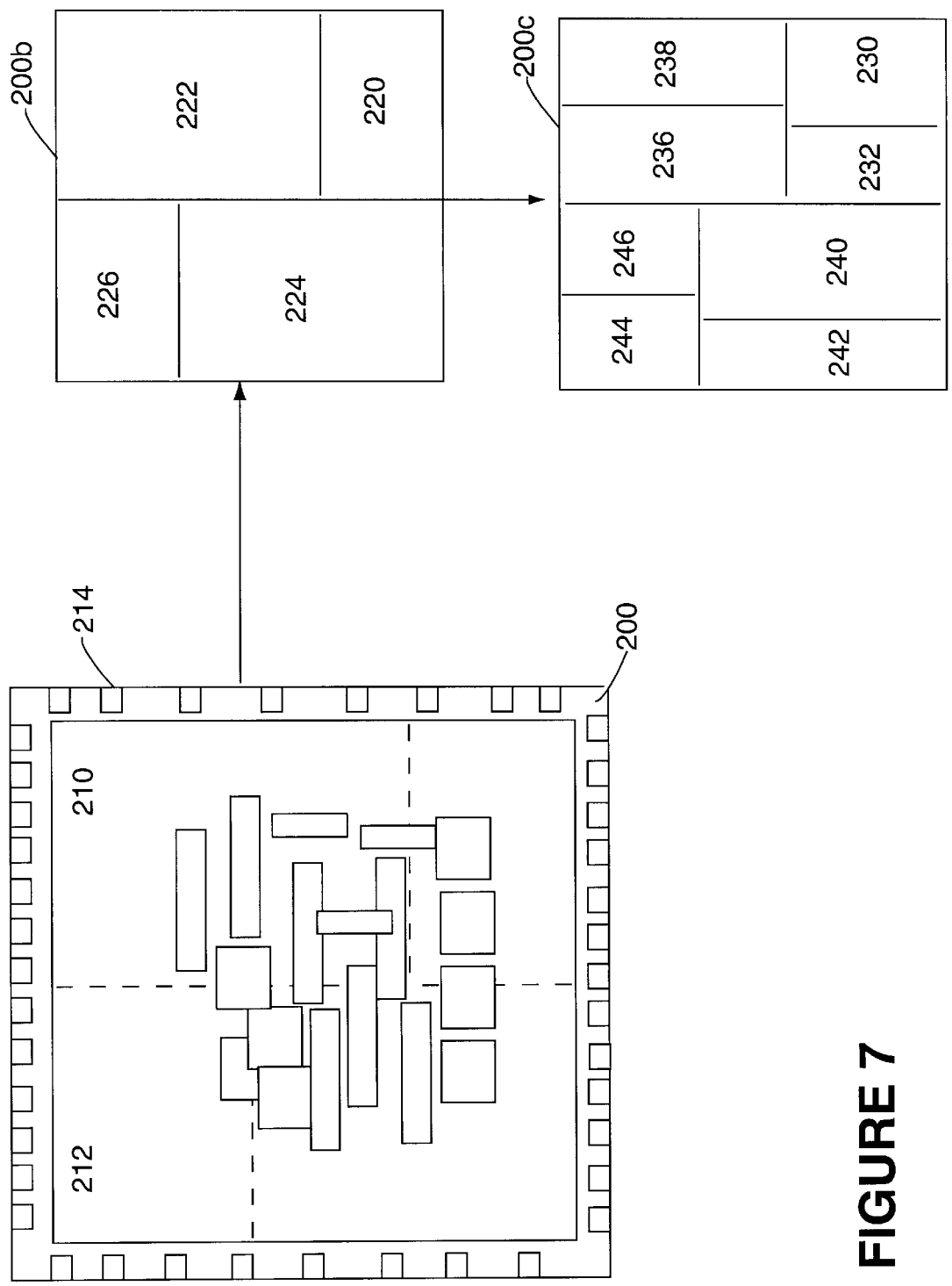
FIG. 7 illustrates partitioning of an integrated circuit design through multiple iterations (e.g., 3) of the partitioning process.

At block 90 of FIG. 6, the design is divided into partitions (or regions) using a min cut procedure where cells falling on the slicing boundary are bipartitioned. FIG. 7 illustrates an original placed design 200 divided into two regions 210 and 212 by a first iteration of block 90. As the flow 80 continues through a second iteration, and the design 200 is further partitioned, the initial region 210 is further divided into regions 222 and 220 and initial region 212 is further divided into regions 226 regions and 224. This is shown in 200b. Through a third iteration, region 222 is divided into regions 236 and 238, region 220 is divided into regions 232 and 230, region 226 is divided into regions 224 and 246, and region 224 is divided into regions 242 and 240. This is shown in 200c. As each region or subregion is made, the cells within that region are given a partitioning constraint keeping them within the same region during the next global optimization performed at block 90. Process 80 does not use the partitioning process 90 to reduce the problem size, but to restrict the freedom of movement of the cells. These partitioning constraints are placed into block 94 (e.g., stored in memory 102 or 104) and are used to provide a better distribution of the cells over the whole placement area.

At the completion of a pass of block 90 of FIG. 6, block 92 is executed to determine if the target region size (e.g., region size) determined by block 84 is met. This value indicates the target size of a given partition or region and can also represent the target number of cells within each region. If this region size or cell count is not satisfied, then processing flows to block 94 where the latest partitioning constraint information is stored and then processing flows to block 86 wherein new connectivity matrices are constructed based on the processing of blocks 88 and 90 and given the constraints 94. The process 80 repeats until the condition at block 92 is satisfied.

At block 96, a final placement of the cells of the design is performed using a number of different well known methods and the placement is adapted to a specific design style. In one method, the cells are arranged and collected in rows. The final product of process 80 is a placed netlist 98 including the information provided in block 82 including the coordinates (e.g., placement) of each cell of the netlist. This placed netlist 98 is stored in memory 102 or 104 of the computer system 112.

The present invention placement process 500 (FIG. 10A and FIG. 10B) utilizes the quadratic placement process 80 (e.g., GORDIAN) to produce a rough placement of an input design. This rough placement is determined after a single pass through blocks 86, 88 and 90 of process 80. However, instead of further representing the connectivity relationships of each multi-pin net using a clique model, as is done by process 80, the present invention represents the connectivity relationship of each multi-pin net using a spanning tree model in which spatial affinities between certain cells can be represented indirectly. Any number of well known spanning tree procedures can be used to produce the spanning tree model without departing from the present invention, including a minimum or optimal spanning tree process. By using the spanning tree model to represent the spatial affinity for elements within an multi-pin net instead of a clique model, the connectivity matrices used in the global optimization procedures are populated with far fewer entries making processing of the connectivity matrices much faster and allowing the matrices to be stored using far fewer computer memory resources.

Figure 8:
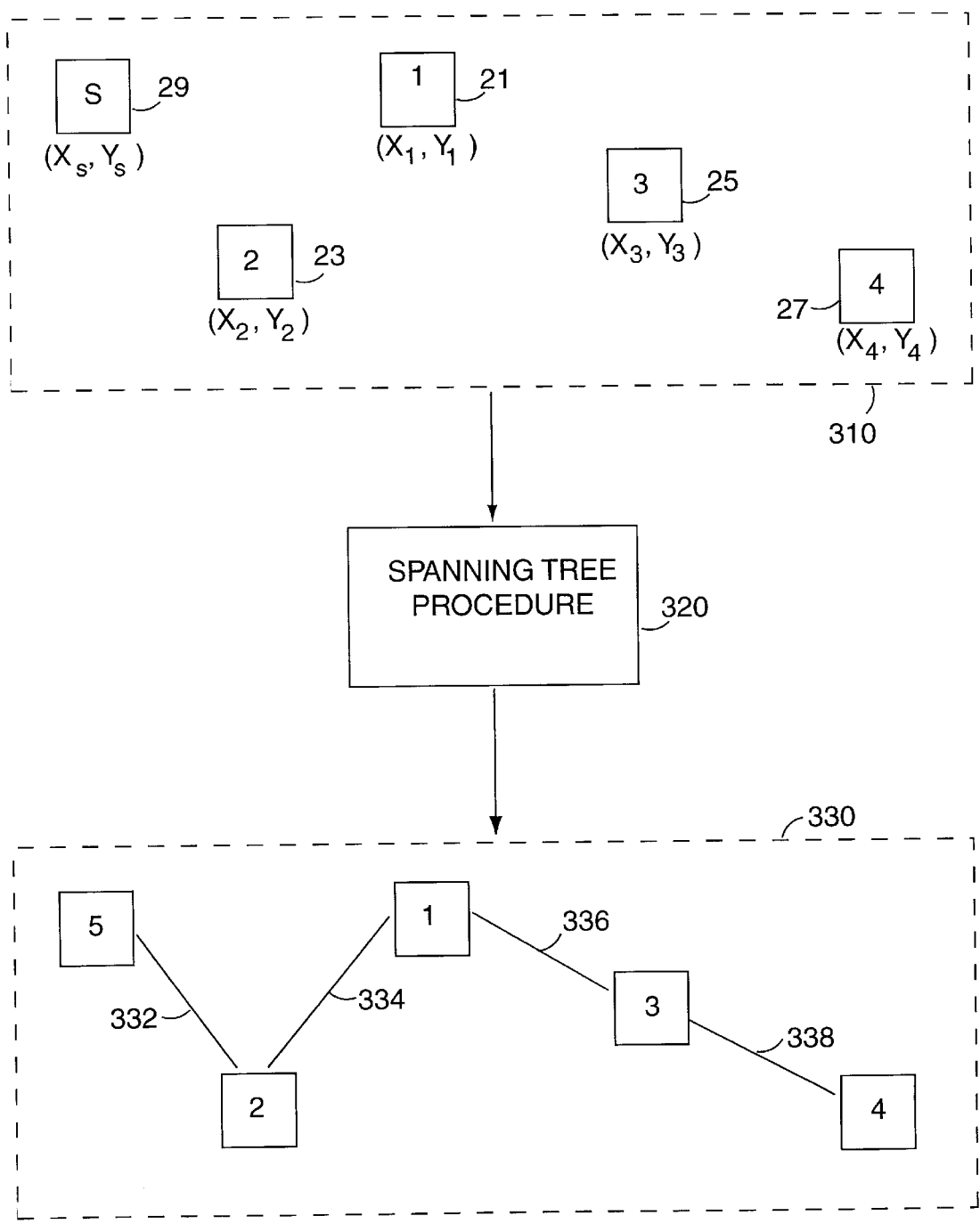
FIG. 8 is an illustration of a rough placement of a multi-pin net in accordance with the present invention and the connectivity relationship after the spanning tree procedure is executed with reference to the multi-pin net.

FIG. 8 illustrates an exemplary multi-pin net shown in dashed area 310. This is the same net as shown in FIG. 2A. After a first pass of process 80, a rough placement is determined for cells 1–5 (corresponding to gates 21–29). Associated with each cell within 310 is a two dimensional (X, Y) coordinate placement, e.g., coordinates $(X_1, Y_1)$–$(X_5, Y_5)$. These coordinates represent the initial placement performed by process 80. The present invention executes a spanning tree procedure on this net. The cells and their coordinates are input from area 310 into the spanning tree process 320.

The spanning tree process 320 of FIG. 8 in accordance with the present invention determines a set of lines that connects cells 1–5 of the multi-pin net on a plane without loops. If a minimum spanning tree process is used, then the set of lines is the minimum length set of lines. Within the spanning tree model, there are no loops between the connections of the cells. It is appreciated that a number of different spanning tree procedures can be used by block 320 without departing from the scope of the present invention. The connections between the cells (e.g., 332, 334, 336, and 338) derived from the spanning tree process 320 represent the connectivity relationship between the cells 1–5 as represented by the spanning tree model. These connections (e.g., 332, 334, 336, and 338) are the spatial affinities of the cells of the net, based on the spanning tree model.

The cells within 310 are connected together by process 320 based on their initial or rough placement. Block 330 illustrates the connections that process 320 generates. Cell5 is coupled to cell2 using line 332, line 334 couples cell2 and cell1, line 336 couples cell1 and cell3, and line 338 couples cell3 and cell4. It is appreciated that the spanning tree model for spatial affinity (e.g., the configuration of 330) closely represents or models the actual physical connections that are used for this multi-pin net when the device is fabricated on a substrate. In other words, cell5 has no direct spatial affinity for cell4 except through its connection to cell2, cell2's connection to cell1, and cell1's connection to cell3.

Figure 9:
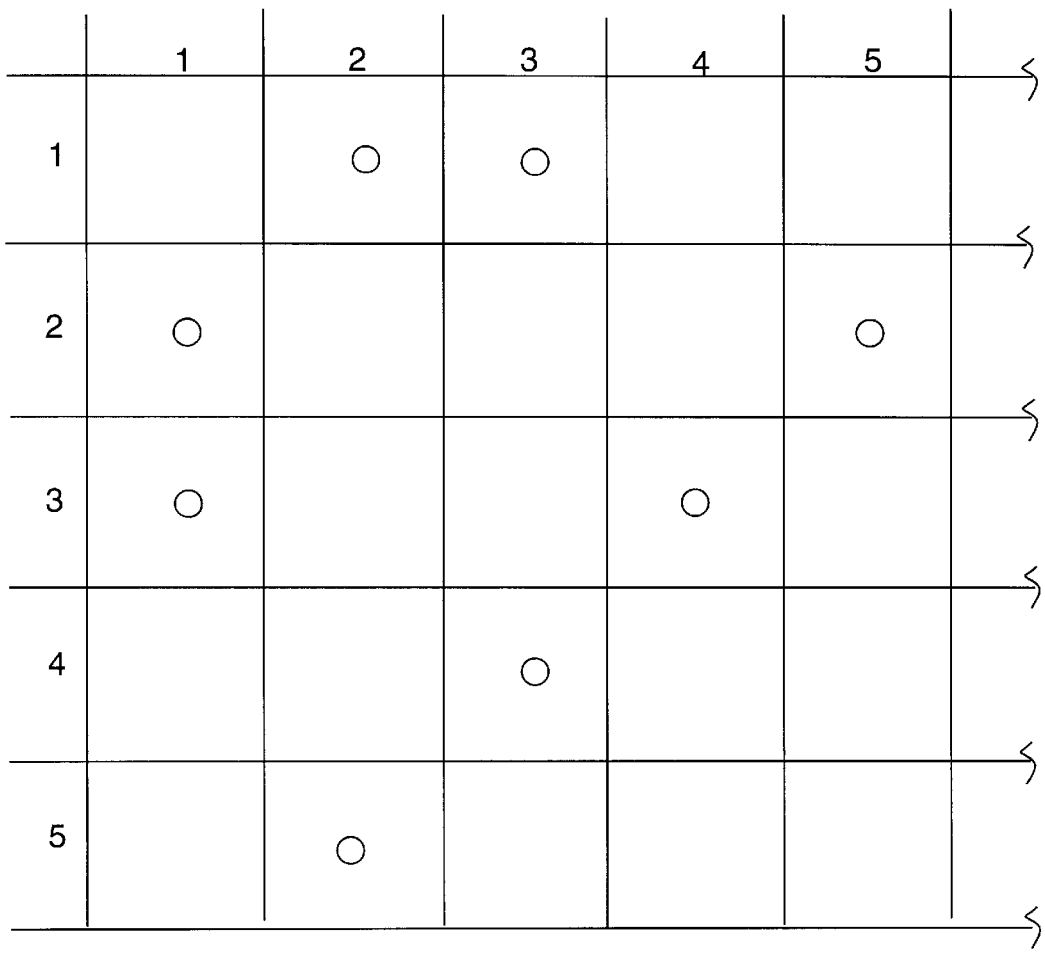
FIG. 9 is a connectivity matrix in accordance with the present invention for a spanning tree model of the multi-pin net of FIG. 8.

A connectivity matrix 400 of FIG. 9 can be generated from the spanning tree model 330 of FIG. 8., The number of connections, R', required to represent a multi-pin net having N pins in a spanning tree model is expressed below:

$$R' = N - 1$$

For the 5 pin multi-pin net of FIG. 8, R'=5–1, or 4. Since the connectivity matrix 400 includes a mirror image representation of the number- of connections, there are 8 non-zero entries within matrix 400 to represent the spanning tree model of the multi-pin net of FIG. 8. Recall that FIG. 4 illustrates the connectivity matrix 60 used to represent the clique model 22 of this same multi-pin net. In matrix 60 there are 20 non-zero entries required to represent this same multi-pin net. With a multi-pin net of 5 pins, the spanning tree model uses less than half the non-zero entries required over the clique model of the prior art.

The difference between spanning tree models and clique models becomes more pronounced when larger net sizes are considered. For instance, assume a multi-pin net having 100 pins. The number of connections and edges used to represent this net using a clique model is equal to (99*100)/2 or 4950. The connectivity matrix therefore contains 4950 or 9900 non-zero entries (the matrix is symmetric, so only ½ requires storage). By contrast, using the spanning tree model, in accordance with the present invention, there are 100-1 or 99 connections and the connectivity matrix would store twice this number or 198 non-zero entries. This is 9702 less non-zero entries required for the spanning tree model. In practice with multi-pin nets within the range of between 5 and 200 pins, the spanning tree model utilizes less storage space approximately as the square root of the storage space required for the clique model.

As described more fully below, according to the present invention the spanning tree model is applied to all multi-pin nets within the determined pin size range (e.g., between 5 and 200 for one embodiment).

Figure 10A:
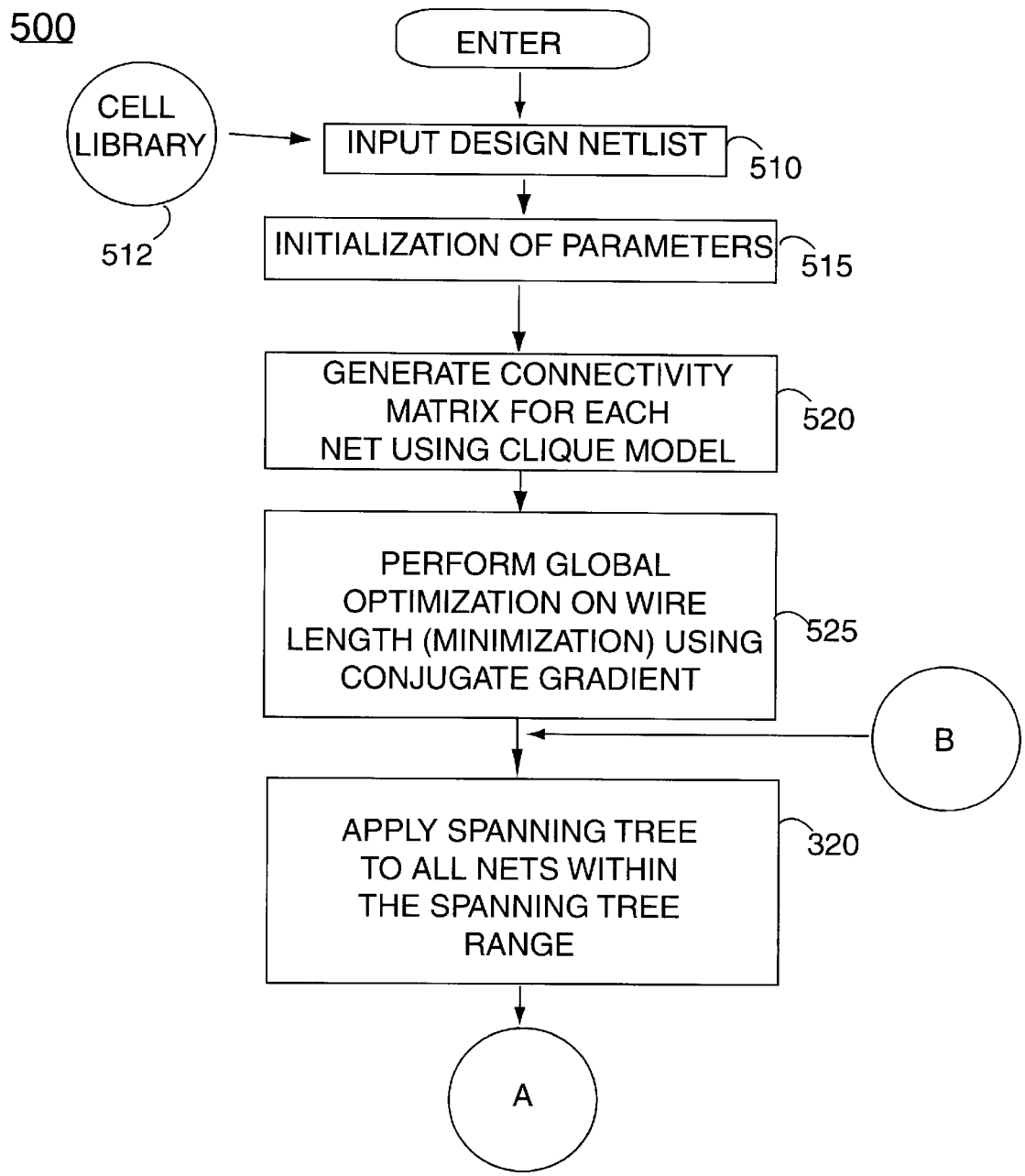
FIG. 10A and FIG. 10B represent a flow diagram illustrating logic steps performed by the quadratic optimization based placement process of the present invention using a spanning tree model for connectivity matrices after the rough placement.
Figure 10B:
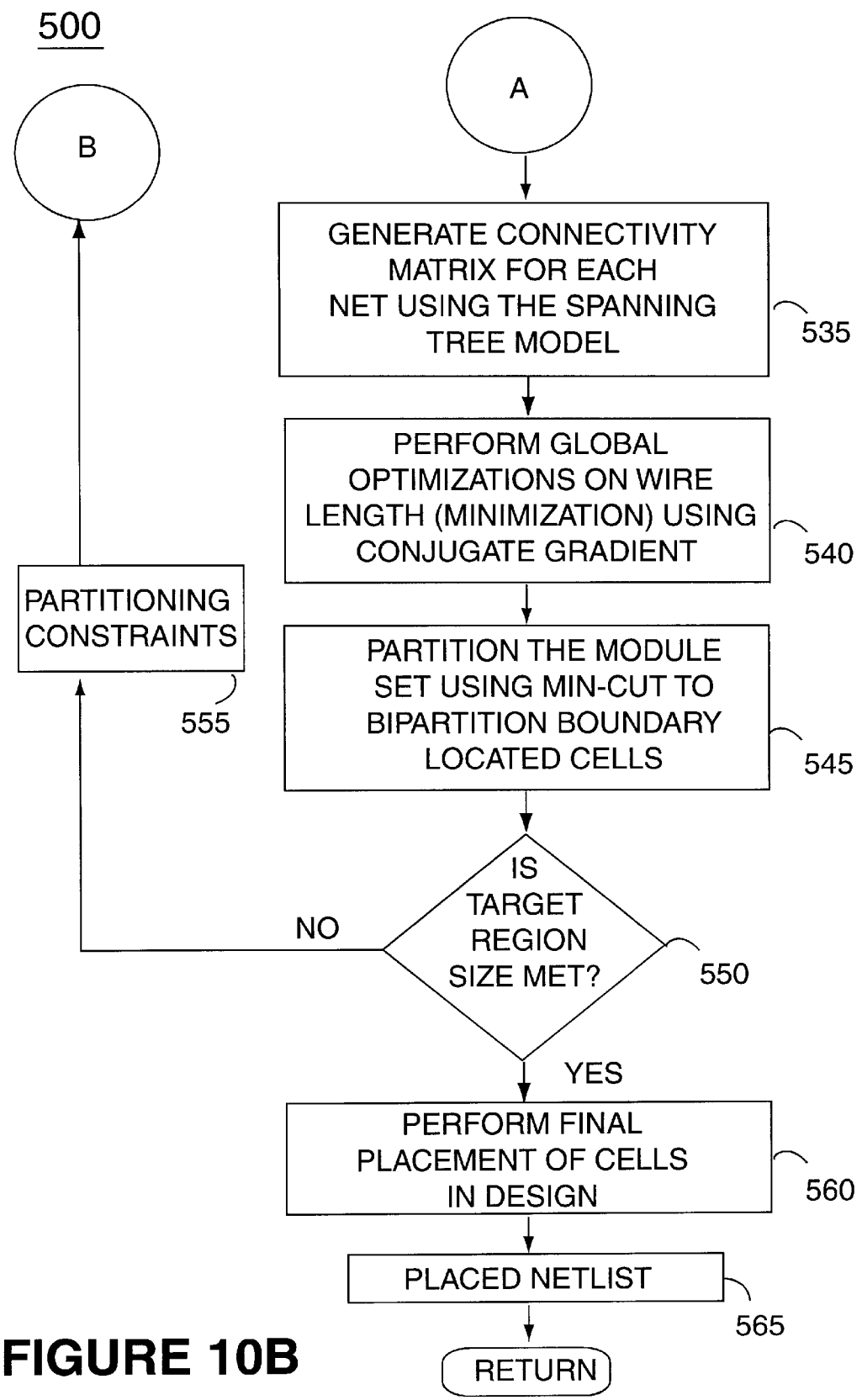

FIG. 10A and FIG. 10B are a flow diagram 500 of the logic blocks performed by the placement process of the present invention using a spanning tree model for multi-pin nets after a rough placement is performed using other models (e.g., a clique model). This process 500 is implemented as program code stored within computer readable memory units (e.g., 102, 103, 104) within computer system 112 of FIG. 1. Process 500, like process 80 (FIG. 6) utilizes quadratic formula based placement processes that are described within above referenced U.S. Pat. No. 5,267,176 by Antreich et al. and is also described within the above referenced article entitled "GORDIAN: VLSI Placement by Quadratic Programming and Slicing Optimization."

Process 500 starts at logic block 510 where an unplaced netlist is input for cell placement. The netlist 510 represents an integrated circuit design for placement (e.g., the input design). The netlist 510 typically includes two pin nets (but need not) and also contains various multi-pin nets. The netlist 510 is analogous to netlist 82 (FIG. 6). At logic block 515 certain parameters are initialized including setting the initial target on the smallest region size (region_size) and setting the target die size is set (e.g., 1.4 times total cell area), for 70% utilization. Also, I/O pin locations are determined either automatically or by predetermined information. At block 515, cliques or similar models are used to represent the spatial affinity of cells for each multi-pin net of the input design. Cell library 512 interfaces with block 510.

The present invention at logic block 520 of FIG. 10A generates the connectivity matrix for each net of the input design based on the clique models generated in logic block 515. Each connectivity matrix for each net can be complied into one large overall connectivity matrix. The non-zero entries of connectivity matrices are stored in computer memory (e.g., 102 or 104) of system 112; and each non-zero entry containing a data value (weight value) and a pointer to the next non-zero entry.

At logic block 525, system 112 applies global optimizations to arrive at cell placement for each net. In this process, block 525 uses quadratic relationships to minimize the distances between the elements of each net that should be connected as indicated by the connectivity matrix for each net. A well known quadratic formula based optimization solution process is used at block 525 and is described in U.S. Pat. No. 5,267,176. To solve this optimization, block 525 uses the well known conjugate-gradient method for globally optimizing and determining the approximate cell locations.

Logic block 525 is "global" in that the optimization procedures are applied across all cells of the design whether or not the design is partitioned into regions.

The cell placement determined by block 525 represents a rough or initial placement of the cells of the design. In this rough placement, each cell contains an (X, Y) coordinate. This rough placement information (e.g., cell coordinates) is passed from block 525 to the spanning tree logic block 320. The present invention at block 320 applies a spanning tree process to nets of the input design to determine the spatial affinities of the cells according to a spanning tree model. This spatial affinity is represented as a set of connections between each cell of each processed net as described with reference to FIG. 8. These connections between cells of a multi-pin net represent the connectivity relationship of the cells of the net as modeled by the spanning tree. Within block 320, the spanning tree procedure is applied only to multi-pin nets within the predetermined range (e.g., having 5 or more pins and having 200 or less pins). The storage and processing time savings for multi-pin nets smaller than the minimum pin range cutoff does not justify the processing overhead required to process them through the spanning tree model. For those nets over the maximum pin range cutoff, normal placement procedures are not applied because these nets are too pervasive throughout the input design.

It is appreciated that the above referenced pin range can be altered. For instance, in many ASIC (application specific integrated circuit) designs; most of the nets contain 5 or fewer numbers of pins per net. In a situation such as this, the predetermined range can be between 3 to 5 pins per net to which the spanning tree procedure is applied.

The connectivity relationships using spanning tree model are used by the present invention, in lieu of the connectivity relationships defined by a clique model, for subsequent placement processing as described below.

After block 320 is complete, the present invention directs system 112 to flow to logic block 535 of FIG. 10B where second connectivity matrices are generated for each net in the input design. When generating these second connectivity matrices, the connectivity relationships determined by the spanning tree model from block 320 are used. These second connectivity matrices are saved into memory 102 or memory 104. At logic block 540, the global optimizations of block 525 are applied to the second connectivity matrices generated by block 525 and again the conjugate-gradient solution method of quadratic formula based placement is performed. The new or revised placement information generated from logic block 540 is then stored in memory (e.g., 102 or 104) and forwarded to logic block 545 for partitioning. A placed netlist is produced.

At logic block 545 of FIG. 10B, the input design is divided into partitions or "regions" using a number of well known procedures (e.g., a min cut procedure can be used where cells falling on the slicing boundary are bipartitioned). This partitioning procedure 545 is analogous to procedure 90 (FIG. 6). As each partition is made, the cells within that partition or region are given a partitioning constraint keeping them located within the same partition or region during the next global optimization iteration performed at block 540. Process 540 does not use the partitioning process 545 to reduce the problem size, but to restrict the freedom of movement of the cells within their partitioning constraints. Every cell of the design is considered simultaneously during placement by block 540. Therefore, block 540 is a global placement process. The partitioning constraints are placed into block 555 (e.g., stored in memory 102 or 104) and are used to provide a better distribution of the cells over the whole placement area.

At the completion of a pass of block 545 of FIG. 10B, the present invention at logic block 550 determines if the target region size (e.g., region-size) determined by block 515 is met. This value indicates the target size of a given partition or region and can also represent the target number of cells within each region. If this region size or cell count is not satisfied, then processing flows to logic block 555 where the latest partitioning constraints are stored. The process 500 flows to block 320 where another spanning tree process is executed on the last placement performed in block 540. Because the relative positions of objects can change due to block 540, the spanning tree is processed after each time the placement is updated to revise the connectivity relationships of the cells of the multi-pin nets. New or revised connectivity matrices are generated at block 535 where the connectivity relationships developed under the spanning tree model are used to generate the connectivity information in each connectivity matrix. Subsequent iterations performed at block 540 take into account (1) the revised connectivity matrices as well as (2) the partitioning constraints 555 when performing global optimizations in that a given cell will not be taken out of its designated partition (region) during global placement by block 540. Block 540 generates a revised placement for the cells of the design each time block 540 is processed. The revised placements can be stored in memory 102 or 104 of computer system 112.

The above process of FIG. 10A and FIG. 10B repeats until the condition at block 550 is satisfied. At logic block 560, a final placement of the cells of the design is performed by the present invention using a number of different well known methods and the placement is adapted to a specific design style. In one method, the cells are arranged and collected in rows. The final product of process 500 is a final placed netlist 565 including the information provided in block 510 and further including the coordinates (e.g., placement) of each cell of the netlist. This final placed netlist 565 is stored in memory 102 or 104 of the computer system 112.

It is appreciated that by using the spanning tree model to represent cell spatial affinity rather than the clique model, after the first iteration, the present invention flow 500 is able to significantly reduce the amount of computer resources required to store the connectivity matrices since only non-zero entries are stored. Further, since the connectivity matrices are far smaller, the quadratic formula based placement routines execute far faster over the prior art. Lastly, since the spanning tree model tends to bias the placement of the cells toward the net's physical placement, a more realistic and efficient layout is performed using less computer memory resources and processing time.

EXAMPLE NETLISTS

Figures 11A, 11B:
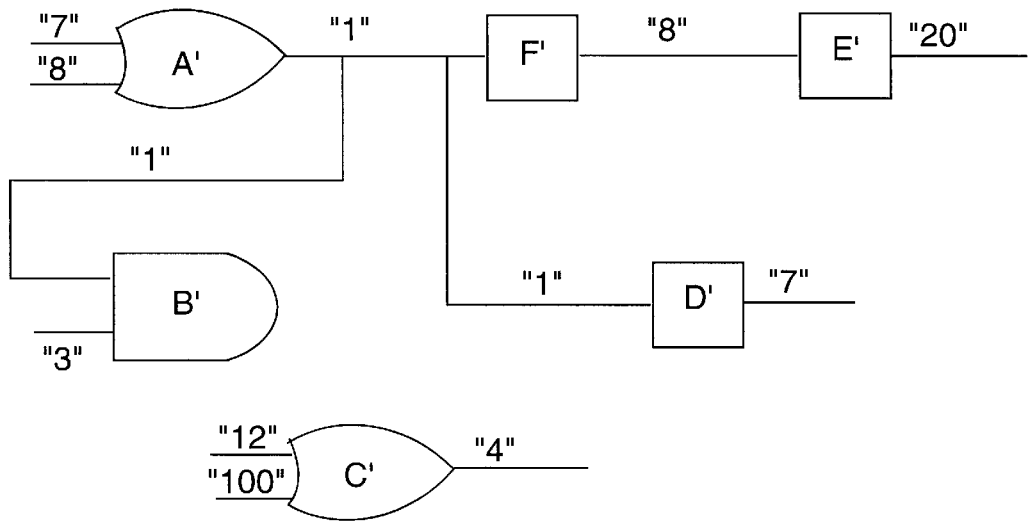
FIG. 11A represents a portion of an exemplary integrated circuit design that can be processed as input by the present invention.
FIG. 11B illustrates an example netlist of the integrated circuit design of FIG. 11A.

FIG. 11A and FIG. 11B illustrate examples of a input circuit design portion 600 and its corresponding unplaced netlist 640. FIG. 11A illustrates a portion 600 of an exemplary input integrated circuit design. Nets 7 and 8 are coupled to AND gate A'. Net 1 is coupled between gate A' and cells F', B' and D'. Net 8 is coupled between cells F' and E' and net 20 is coupled to cell E'. Net 7 is coupled to cell D' and net 3 is coupled to AND gate B'. Nets 12 and 100 are input to OR gate C' and net 4 is output from gate C'. As shown, at least net 1 is a multi-pin net.

FIG. 11B illustrates a netlist representation 640 of the design portion 600 shown in FIG. 11A. This netlist representation 640 is similar to the format used for input netlist 510 of FIG. 10A. The netlist portion 640 is stored in memory (e.g., 102 or 104) and for each cell of the integrated circuit design, the netlist 640 contains a row or entry. Each entry contains the cell's identification 642 and also the nets that are coupled to the cell 644 (the cells net listing). The format of the netlist can vary without departing from the present invention but one exemplary format as shown in FIG. 11B lists the output net first followed by the input nets. The entry corresponding to cell C' is "4, 12, 100" indicating 4 is the output net and 12 and 100 are the input nets.

Figures 12A, 12B, 12C:
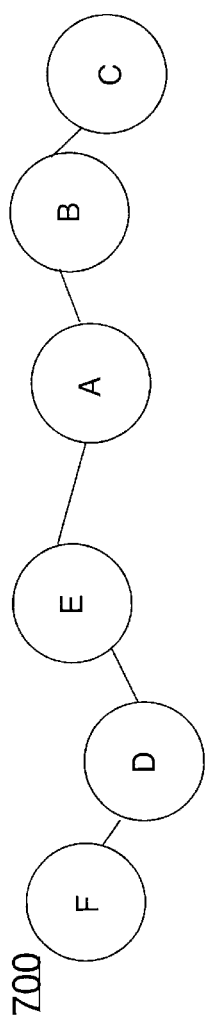
FIG. 12A illustrates a spanning tree model of the multi-pin net of the integrated circuit design of FIG. 11A as generated in accordance with the present invention.
FIG. 12B illustrates a connectivity matrix in accordance with the present invention of the integrated circuit design of FIG. 11A using a clique model of the multi-pin net.
FIG. 12C illustrates a connectivity matrix in accordance with the present invention of the integrated circuit design of FIG. 11A using a spanning tree model of the multi-pin net.

FIG. 12A illustrates another exemplary net composed of different cells A–F after being processed by the spanning tree process 320 of the present invention. FIG. 12A shows the spanning tree modeled connectivity relationship between cells A–F (not their physical input/output connections). FIG. 12B illustrates an exemplary connectivity matrix 720 generated based on the net shown in FIG. 12A but uses a clique model for representing the spatial affinity of the cells A–F. This matrix 720 is generated by block 520 of FIG. 10A during the rough placement of the cells. As seen, $(5^*6)/2$, or 15 connections are required to represent the net in a clique model and twice that number or 30 non-zero entries are required to populate matrix 720. It is appreciated that in matrix 720 only one half of the data needs storage, as the data is symmetrical.

FIG. 12C illustrates a connectivity matrix 730 representing the spatial affinity for the net of FIG. 12A using the spanning tree model. This matrix 730 is generated by block 535 of FIG. 10B and is used for global optimizations using quadratic formula placement. This process follows the rough placement of the present invention. As seen, 6-1, or 5 connections are required to represent the net in a spanning tree model and twice that number or 10 non-zero entries are required to populate matrix 730 although only 5 data points require storage as the data is symmetrical. Far fewer computer memory resources are needed to store matrix 730 over matrix 720 and in addition far less computer processing time is required to optimize matrix 730 over 720 (e.g., as required by block 540).

The preferred embodiment of the present invention, a placement process is described using a quadratic placement procedure over a first pass-using a clique net model to obtain a rough cell placement and subsequently thereafter using a spanning tree model to represent the spatial affinity for cells in nets thus reducing the sizes of connectivity matrices and reducing processing time to arrive at the placed netlist. While the present invention has been described in particular embodiments, it should be appreciated that the present invention should not be construed as limited by such embodiments, but rather construed according to the below claims.

What is claimed is:

1. A computer controlled method for placing cells of an integrated circuit design represented as an unplaced netlist comprising the computer implemented steps of:

(a) generating first connectivity matrices for each net of said netlist utilizing clique models to represent spatial affinities for cells within each multi-pin net wherein said first connectivity matrices contain non-zero entries representing spatial affinities between cells of each net;

(b) performing global quadratic optimization based placement on said design utilizing said first connectivity matrices to produce a rough placement of said cells of said netlist;

(c) generating spanning tree connectivity relationships for multi-pin nets of said netlist by performing a spanning tree procedure on said multi-pin nets utilizing cell locations of said rough placement of said cells of said netlist;

(d) generating second connectivity matrices for each multi-pin net of said netlist utilizing said spanning tree connectivity relationships wherein said second connectivity matrices contain non-zero entries representing spatial affinities between cells of each net; and (e) performing said global quadratic optimization based placement on said design utilizing said second connectivity matrices to produce a placed netlist.

2. A method as described in claim 1 further comprising the steps of:

(f) partitioning said placed netlist into regions and defining partition constraints for cells of each region;

(g) generating revised spanning tree connectivity relationships for said multi-pin nets by performing said spanning tree procedure on said multi-pin nets based on cell locations of said placed netlist;

(h) revising said second connectivity matrices for each multi-pin net utilizing said revised spanning tree connectivity relationships;

(i) performing said global quadratic optimization based placement utilizing revised second connectivity matrices and utilizing said partitioning constraints to produce a revised placed netlist;

(j) partitioning regions of said revised placed netlist into subregions and defining partition constraints for cells of each subregion;

(k) repeating steps (g)–(j) until a predetermined set of cells exist within each subregion of said revised placed netlist.

3. A method as described in claim 1 wherein said global quadratic optimization based placement utilizes a conjugate gradient procedure to minimize distances between cells having a connectivity relationship.

4. A method as described in claim 1 wherein said spanning tree procedure is a minimum spanning tree procedure.

5. A method as described in claim 1 wherein step of (c) generating spanning tree connectivity relationships for multi-pin nets of said netlist by performing a spanning tree procedure on said multi-pin nets utilizing cell locations of said rough placement of said cells of said netlist comprises the steps of:

determining those multi-pin nets that fall within a designated range of pin sizes between a minimum pin size and a maximum pin size; and applying said spanning tree procedures only to those multi-pin nets that fall within said designated range of pin sizes.

6. A method as described in claim 1 wherein said unplaced netlist comprises a list of cells of said design and a list of input and output nets associated with each cell and wherein said placed netlist comprises contents of said unplaced netlist and two dimensional coordinates of each cell of said design.

7. A method as described in claim 1 wherein said step of (a) generating first connectivity matrices for each net of said netlist utilizing clique models to represent spatial affinities for cells within each multi-pin net comprises the step of storing only said non-zero entries of said first connectivity matrices into a computer memory unit wherein each non-zero entry contains a connection value and a pointer to a next non-zero entry.

8. A computer controlled method for placement of cells of an integrated circuit design represented as an unplaced netlist having cells and connections between cells, said method comprising the computer implemented steps of:

(a) placing said cells of said netlist utilizing connectivity relationships based on clique models that represent spatial affinities for cells of multi-pin nets of said design and generating a rough placement of said cells; and (b) performing second and subsequent processes on said cells of said netlist to determine and revise a second placement of said cells of said netlist, said step (b) comprising the further steps of:

(1) generating spanning tree connectivity relationships for multi-pin nets of said netlist by performing a spanning tree procedure on said multi-pin nets utilizing cell locations determined in said rough placement of said cells of said netlist;

(2) placing said cells of said netlist utilizing said spanning tree connectivity relationships to represent spatial affinities for cells of said multi-pin nets wherein said spanning tree connectivity relationships require less memory for storage than said connectivity relationships based on clique models;

(3) revising said spanning tree connectivity relationships for multi-pin nets of said netlist by performing a spanning tree procedure on said multi-pin nets utilizing cell locations determined in step (2); and (4) repeating steps (2) and (3) until a final placed netlist is performed.

9. A method as described in claim 8 wherein said step of (2) placing said cells of said netlist utilizing said spanning tree connectivity relationships to represent spatial affinities for cells of said multi-pin nets comprises the step of using quadratic optimization based placement with a conjugate gradient procedure.

10. A method as described in claim 9 wherein said step of (2) placing said cells of said netlist utilizing said spanning tree connectivity relationships to represent spatial affinities for cells of said multi-pin nets further comprises the steps of:

generating connectivity matrices based on said spanning tree connectivity relationships for each multi-pin net of said design;

storing non-zero entries of said connectivity matrices into a computer memory unit; and partitioning regions of said design into subregions.

11. A method as described in claim 10 wherein said step of (4) repeating steps (2) and (3) until a final placed netlist is performed comprises the steps of:

determining a fixed number of cells within each subregion of said design;

comparing said fixed number of cells with a predetermined number of cells; and repeating steps (2) and (3) while said fixed number of cells is larger than said predetermined number of cells.

12. A method as described in claim 9 wherein said spanning tree procedure is a minimum spanning tree procedure.

13. A method as described in claim 9 wherein step of (3) revising said spanning tree connectivity relationships for multi-pin nets of said netlist by performing a spanning tree procedure on said multi-pin nets comprises the steps of:

determining those multi-pin nets that fall within a designated range of pin sizes between a minimum pin size and a maximum pin size; and applying said spanning tree procedure only to those multi-pin nets that fall within said designated range of pin sizes.

14. A computer system including a processor coupled to bus and a memory unit coupled to said bus, said system programmed to include placement logic for placing cells of an integrated circuit design represented as an unplaced netlist having cells and connections between cells, said placement logic comprising:

(a) first matrix logic generating first connectivity matrices for each net of said netlist utilizing clique models to represent spatial affinities for cells within each multi-pin net wherein said first connectivity matrices contain non-zero entries representing spatial affinities between cells of each net;

(b) first placement logic coupled to said first matrix logic performing global quadratic optimization based placement on said design utilizing said first connectivity matrices to produce a rough placement of said cells of said netlist;

(c) spanning tree logic generating spanning tree connectivity relationships for multi-pin nets of said netlist by performing spanning tree procedures on said multi-pin nets utilizing cell locations of said rough placement -of said cells of said netlist;

(d) second matrix logic coupled to said spanning tree logic and generating second and subsequent connectivity matrices for each multi-pin net utilizing said spanning tree connectivity relationships wherein said second and subsequent connectivity matrices contain non-zero entries representing spatial affinities between cells of each net; and (e) second placement logic performing said global quadratic optimization based placement utilizing said second and subsequent connectivity matrices to produce a placed netlist.

15. A computer system as described in claim 14 wherein said second placement logic further comprises partitioning logic partitioning said placed netlist into regions and defining partition constraints for cells in each region.

16. A computer system as described in claim 14 wherein said second placement logic comprises conjugate gradient logic using a conjugate gradient procedure to minimize distances between cells having a connectivity relationship.

17. A computer system as described in claim 14 wherein said spanning tree procedure is a minimum spanning tree procedure.

18. A computer system as described in claim 14 wherein said spanning tree logic comprises:

determining logic determining those multi-pin nets that fall within a designated range of pin sizes between a minimum pin size and a maximum pin size; and application logic applying said spanning tree procedures only to those multi-pin nets that fall within said designated range of pin sizes.

19. A computer system as described in claim 14 wherein said unplaced netlist comprises a list of cells of said design and a list of input and output nets associated with each cell and wherein said placed netlist comprises contents of said unplaced netlist and two dimensional coordinates of each cell of said design.

20. A computer system as described in claim 14 wherein said second matrix logic comprises storing logic storing only said non-zero entries of said second and subsequent connectivity matrices into a computer memory unit wherein each non-zero entry contains a connection value and a pointer to a next non-zero entry.

\* \* \* \* \*